United States Patent
Chen et al.

(10) Patent No.: US 7,018,929 B2
(45) Date of Patent: Mar. 28, 2006

(54) METHOD FOR REDUCING A LOW VOLATILITY BYPRODUCT FROM A WAFER SURFACE FOLLOWING AN ETCHING PROCESS

(75) Inventors: Yei-Ren Chen, Shinjuang (TW); Hung-Wen Chen, Taichung (TW); Chi-How Wu, Tainan (TW); Zhi-Yong Chang, Hsin Chu (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 298 days.

(21) Appl. No.: 10/187,872

(22) Filed: Jul. 2, 2002

(65) Prior Publication Data
US 2004/0005784 A1    Jan. 8, 2004

(51) Int. Cl.
*H01L 21/302* (2006.01)
*H01L 21/3065* (2006.01)
(52) U.S. Cl. ...................... 438/706; 438/710; 438/712; 156/345
(58) Field of Classification Search ................ 438/706, 438/710, 712; 738/712; 156/345, 345.1
See application file for complete search history.

(56) References Cited

U.S. PATENT DOCUMENTS

| | | | | |
|---|---|---|---|---|
| 5,397,432 A | * | 3/1995 | Konno et al. | 438/714 |
| 6,051,286 A | * | 4/2000 | Zhao et al. | 427/576 |
| 6,091,060 A | * | 7/2000 | Getchel et al. | 219/483 |
| 6,350,699 B1 | * | 2/2002 | Maa et al. | 438/720 |
| 6,635,185 B1 | * | 10/2003 | Demmin et al. | 216/64 |

* cited by examiner

*Primary Examiner*—Nadine G. Norton
*Assistant Examiner*—Lynette T. Umez-Eronini
(74) *Attorney, Agent, or Firm*—Tung & Assoc.

(57) ABSTRACT

A method for in-situ reduction of volatile residual contamination on a semiconductor process wafer following a plasma etching process including providing an ambient controlled chamber for accepting transfer of a semiconductor process wafer under controlled ambient conditions following a plasma etching process; providing a heat exchange surface disposed with the ambient controlled chamber in heat exchange relationship with means for heating the heat exchange surface; transferring a semiconductor process wafer having volatile residual contamination under controlled ambient conditions to the ambient controlled chamber; mounting the semiconductor process wafer in heat exchange relationship with the heat exchange surface; and, heating in-situ the heat exchange surface for a time period to thereby heat the semiconductor process wafer to vaporize the volatile residual contamination on the semiconductor process wafer while simultaneously removing a resulting vapor from the ambient controlled chamber.

20 Claims, 2 Drawing Sheets

METHOD FOR REDUCING A LOW VOLATILITY BYPRODUCT FROM A WAFER SURFACE FOLLOWING AN ETCHING PROCESS

FIELD OF THE INVENTION

This invention generally relates to semiconductor wafer cleaning methods and more particularly to low volatility residues remaining on semiconductor wafer surfaces following dry etching processes.

BACKGROUND OF THE INVENTION

In the integrated circuit industry today, hundreds of thousands of semiconductor devices are built on a single chip. Every device on the chip must be electrically isolated to ensure that it operates independently without interfering with another. The art of isolating semiconductor devices has become an important aspect of modern metal-oxide-semiconductor (MOS) and bipolar integrated circuit technology for the separation of different devices or different functional regions. With the high integration of the semiconductor devices, improper electrical isolation among devices will cause current leakage, and the current leakage can consume a significant amount of power as well as compromise functionality. Among some examples of reduced functionality include latch-up, which can damage the circuit temporarily, or permanently, noise margin degradation, voltage shift and cross-talk.

Shallow trench isolation (STI), is the preferred electrical isolation technique especially for a semiconductor chip with high integration. In general, conventional methods of producing an STI feature include forming a hard mask over the trench layer, patterning a photoresist etching mask over the hard mask, etching the hard mask through the photoresist etching mask to form a patterned hard mask, and thereafter etching the trench layer to form the STI feature. Subsequently, the photoresist etching mask is removed and the STI feature is back-filled with a dielectric material.

Frequently STI features are etched in a sequential process flow, where the mask layers are etched in one chamber and the silicon trench is etched in another chamber. Dry etching is performed by way of a plasma, or reactive ion etch (RIE). Typically, in a plasma etching process, an etchant source gas is supplied to an etching chamber where the plasma is ignited to generate ions from the etchant source gas. Ions are then accelerated towards the process wafer surface, frequently by a voltage bias, where they impact and remove material (etch) from the process wafer. Various gas chemistries are used to provide variable etching rates for different etching target materials. Frequently used dry etchant source gases include chloro and fluoro-hydrocarbons in addition to chlorine ($Cl_2$) and HBr to etch through a metal nitride layer, for example silicon nitride (SiN), followed by etching through a silicon layer to form, for example, a shallow trench isolation (STI) feature.

One chemistry for etching through silicon, for example, includes a $Cl_2/O_2/HBr$-based chemistry. During and after the etching process halogen species such as chlorine and bromine which are highly hydrophilic remain on the process wafer target surface where, for example, they are incorporated into the sidewalls and bottoms of etched features as well as into overlying layers of photoresist. Since water is also present in and around the process wafer target surface, corrosive condensates including, for example, HBr and HCl may form on the process wafer surface causing corrosive damage to etched features, especially the edges and corners. HBr, for instance, is a highly corrosive acid that is frequently formed on the surface of the process wafer, especially at etched feature edges where the higher surface tension facilitates condensation.

FIG. 1A shows a schematic representation of typical process chamber configuration used in STI etching. The typical STI etching apparatus, for example, includes several different ambient controlled etching chambers, 10, 12, 14, and 16, in addition to a wafer orientation chamber 18, a cool down chamber 24 and loadlock chambers 20 and 22, all ambient controlled. The robotic arm transfer mechanism 26 is centrally located in central ambient controlled transfer chamber 28. In a typical process in STI etching, as explained, several different etching steps with different etching chemistries may be involved thus necessitating transfer of the process wafer by robotic arm 26 between multiple etching chambers, for example 10, 12, 14, and 16. Following etching, the process wafer may be transferred through transfer chamber 28 by robotic arm 26 to cool down chamber 24 to cool the process wafer prior to transfer to loadlock chamber, for example, 20 or 22 where the chamber is pressurized to atmospheric pressure for unloading the process wafer.

For example, referring to FIG. 1B process flow diagram, in operation, according to the prior art, in an STI process, a process wafer (not shown) is loaded according to process 102 into loadlock chamber e.g., 20 where robotic arm 26 transfers the wafer to wafer orientation chamber 18 under controlled ambient conditions through transfer space 28 for wafer orientation process 104 followed by process step 106 where the process wafer is transferred to e.g., chamber 10 for dry etching through an upper layer of silicon nitride on the process wafer surface defined by an overlying layer of photoresist, the dry etching chemistry, for example, including HBr and $Cl_2$. Following process 106, the process wafer is transferred to e.g., chamber 14 where process 108 including dry etching through an underlying silicon layer to form the trench for the STI is carried out, chamber 34 being optimized for carrying out the dry etching process. Following trench forming dry etching process 108, the process wafer is typically transferred via robotic arm 26 to ashing chamber, e.g., 12 where the photoresist is at least partially removed according to an oxygen plasma ashing process 110. Following process 110, the process wafer is typically transferred to chamber, e.g., 24, for cooling down process 112 prior to transfer to loadlock chamber e.g., 22 for unloading process 114. Following the unloading process, the wafer is typically subjected to another ex-situ wet etching process 116 followed by ex-situ cleaning process 118 to remove residual contamination, including HBr and HCl, remaining on the process wafer surface.

During the dry etching processes to form the STI feature, corrosive volatile residues including, for example, HBr and HCl may condense onto the process wafer surface which may also have residual particles adhering to the surface from the etching process. Further, during the pressurization process in the loadlock chamber to remove the process wafer, the residual particles including corrosive condensates may become dislodged and adhere to the chamber walls and robotic arm thereby causing corrosive damage to the chamber and associated chamber parts. As a result, over time, the loadlock chamber accumulates residual corrosive particles which can contaminate process wafers causing corrosive damage as they are moved through the loadlock chamber thereby necessitating frequent equipment shutdown for cleaning. Another shortcoming of the prior art procedure and apparatus for STI etching, and etching in general, may be potential adverse health consequences to equipment operators from an undesired buildup of such contamination and associated vapors present within the chamber and upon the process wafer upon unloading the process wafer. HBr fumes, for example, are known to be highly dangerous and costly safety procedures are made necessary by the residual HBr contamination on the process wafer.

The practice in the prior art, for removing residual contaminants, for example, HBr or HCl, utilizes an ex-situ cleaning procedure where the process wafer is either heated or exposed to ultraviolet light to volatize (vaporize) the residual contamination. In addition, costly automated optical imaging systems to spot defects caused by the corrosive residual contamination are made necessary to ensure quality control.

There is therefore a need in the semiconductor processing art to develop methods whereby the level of residual contaminants remaining on semiconductor process wafers following dry etching is reduced thereby minimizing damage to both the process wafer and etching apparatus as well as reducing the danger of adverse health consequences to manufacturing personnel.

It is therefore an object of the invention to provide a method whereby the level of residual contamination remaining on semiconductor process wafers following a dry etching process is reduced thereby minimizing damage to both the process wafer and etching apparatus as well as reducing the danger of adverse health consequences to manufacturing personnel while overcoming other shortcomings and deficiencies in the prior art.

SUMMARY OF THE INVENTION

To achieve the foregoing and other objects, and in accordance with the purposes of the present invention, as embodied and broadly described herein, the present invention provides a method and apparatus for in-situ reduction of volatile residual contamination on a semiconductor process wafer following a plasma etching process.

In a first embodiment of the present invention, a method is provided for in-situ reduction of volatile residual contamination on a semiconductor process wafer following a plasma etching process including providing an ambient controlled chamber for accepting transfer of a semiconductor process wafer under controlled ambient conditions following a plasma etching process including providing a heat exchange surface disposed within the ambient controlled chamber in heat exchange relationship with means for heating the heat exchange surface; transferring a semiconductor process wafer having volatile residual contamination under controlled ambient conditions to the ambient controlled chamber; mounting the semiconductor process wafer in heat exchange relationship with the heat exchange surface; and, heating in-situ the heat exchange surface for a time period to thereby heat the semiconductor process wafer to vaporize the volatile residual contamination on the semiconductor process wafer while simultaneously removing a resulting vapor from the ambient controlled chamber.

In a related embodiment, the step of heating in-situ is carried out at a substantially constant temperature.

In another related embodiment the step of heating in-situ is carried out while varying a heating temperature of the semiconductor process wafer over the time period.

In yet another related embodiment, the heating temperature is increased over a temperature range at a constant rate.

In another embodiment the step of heating in-situ is carried out for the time period sufficient to remove from about 50 percent to about 100 percent of the volatile residual contamination.

In a further embodiment, the ambient controlled chamber is included in a plurality of ambient controlled chambers including a shared ambient transfer space.

In yet a further embodiment, the method further includes the step of transferring the semiconductor process wafer to an unloading chamber under controlled ambient conditions for unloading the semiconductor process wafer following the step of heating in-situ.

In another embodiment, the means for heating the heat exchange surface comprises electrically resistive heating elements in heat exchange relationship with the heat exchange surface.

In yet another embodiment, the semiconductor process wafer is heated within a temperature range of about 80 degrees Centigrade to about 120 degrees Centigrade.

In a related embodiment, the ambient pressure within the ambient controlled chamber is maintained within a range of 10 milliTorr to 500 milliTorr.

In another related embodiment, the step of heating in-situ further comprises the time period of about 40 to about 90 seconds.

In another embodiment, the means for heating the heat exchange surface comprises a heat exchange fluid in heat exchange relationship with the heat exchange surface and in fluidic communication with a heat exchanger.

In another embodiment, the heat exchange surface includes a temperature sensor in communication with a controller for controlling a rate of thermal energy delivered to the heat exchange surface. Further, the controller is selectively programmable to effectuate a heating profile over time at the heat exchange surface.

In yet another related embodiment, the volatile residual contamination includes at least one of HBr, HCl and HF.

In a separate embodiment of the present invention, a semiconductor wafer heating system for reducing volatile residual contamination in-situ on a semiconductor process wafer following a plasma etching process is provided including an ambient controlled chamber for accepting transfer of a semiconductor process wafer under controlled ambient conditions following a plasma etching process; a means for controlling an ambient within the ambient controlled chamber including a pressure; a heat exchange surface disposed within the ambient controlled chamber for mounting the semiconductor process wafer in heat exchange relationship; and, a means for heating the heat exchange surface according to a temperature profile over time.

In a related embodiment, the means for heating the heat exchange surface comprises electrically resistive heating elements in heat exchange relationship with the heat exchange surface said electrically resistive heating elements supplied with power by a selectively controllable power source. Further included is a controller in communication with a means for sensing a temperature of the heat exchange surface and in responsive communication with the selectively controllable power source for responsively varying a power for controlling a preselected temperature profile over time at the heat exchange surface.

In a related embodiment, the ambient controlled chamber is included in a plurality of ambient controlled chambers including a means for remotely transferring a semiconductor process wafer under ambient controlled conditions from at least a first ambient controlled chamber to at least a second ambient controlled chamber.

In yet another embodiment, the means for heating the heat exchange surface comprises a heat exchange fluid supplied by a selectively temperature controllable heat exchanger in fluidic communication with the heat exchange surface.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

Figure 1A:
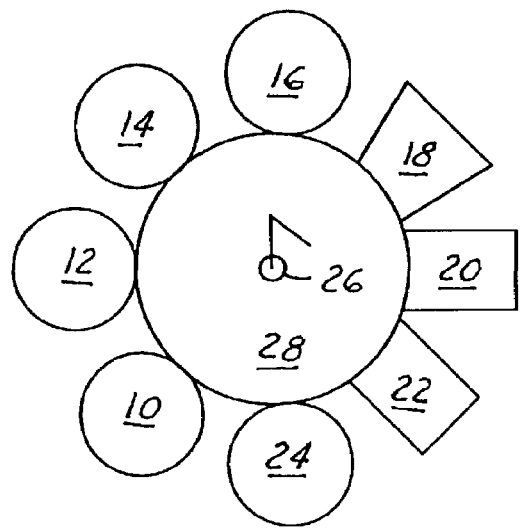
FIG. 1A is a schematic representation of a typical plasma etching system according to the prior art.
Figure 1B:
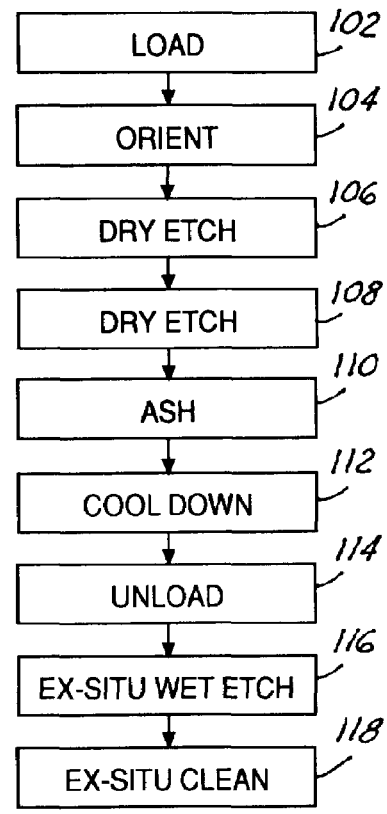
FIG. 1B is a schematic flow diagram of a typical STI manufacturing process according to the prior art.

The method and apparatus according to the present invention is more clearly described by referring to FIG. 2. FIG. 2 is a schematic representation of a multiple chamber ambient controlled processing system for carrying out shallow trench isolation (STI) etching. As previously discussed with reference to FIG. 1, several modular processing chambers may be attached to the processing system for carrying out different procedures. An exemplary system, for example, is the Centura 5200™ commercially available from Applied Materials, Inc. The multiple chamber system has the capability of transferring a process wafer between its chambers under controlled ambient conditions and without exposing the wafer to moisture or other contaminants that may be present outside the multiple chamber system. One advantage of the multiple chamber system is that different chambers in the multiple chamber system may be used for different purposes in a sequential manufacturing process, for example, including different dry etching processes optimized for different chemistries and conditions in different chambers. The process may proceed uninterrupted within the multiple chamber system, thereby preventing contamination of wafers that often occurs when transferring wafers between various separate individual chambers necessitating exposure to atmospheric pressure.

Figure 2A:
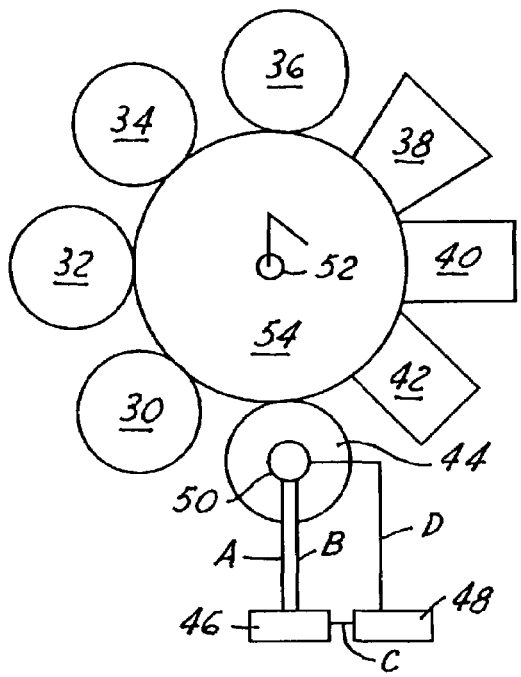
FIG. 2A is a schematic representation of a plasma etching system showing selected features of the present invention.

For example, referring to FIG. 2A, in an STI manufacturing process several different etching chambers optimized for different etching steps may be used as shown, for example, at 30, 32, 34, and 36, while another chamber, for example 38 may be used for wafer orientation, and other chambers, for example, 40 and 42, used for loading and unloading process wafers. In the method according to the present invention, a wafer heating plate 50 may be added to any of the etching chambers, e.g., 30, 32, 34, and 36, or more preferably added to a chamber devoted specifically to heating the process wafer, e.g., chamber, 44 to heat the semiconductor wafer in-situ prior to transferring the wafer to another chamber, for example, a loadlock chamber, e.g., 40 or 42, for unloading. Preferably, the wafer heating plate is added to one of the chambers in the multi-chamber system to heat the process wafer prior to transfer by robotic arm 52 through ambient controlled transfer chamber 54 to loadlock chamber e.g., 40 or 42 for unloading.

Figure 2B:
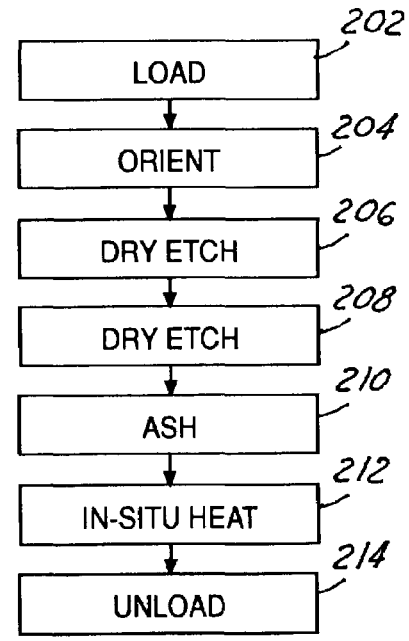
FIG. 2B is a schematic flow diagram of an exemplary STI manufacturing process according to the present invention.

For example, in exemplary operation, referring to FIG. 2B process flow diagram, in a shallow trench isolation (STI) process, a process wafer (not shown) is loaded according to process 202 into loadlock chamber e.g., 40 where robotic arm 52 transfers the wafer to wafer orientation chamber 38 under controlled ambient conditions through transfer space 54 for wafer orientation process 204 followed by process step 206 where the process wafer is transferred to e.g., chamber 30 for dry etching through an upper layer of silicon nitride on the process wafer surface defined by an overlying layer of photoresist, the dry etching chemistry, for example, including 50% HBr, $O_2$, $CF_4$, and $Cl_2$. Following process 206, the process wafer is transferred to e.g., chamber 34 where process 208 including dry etching through an underlying silicon layer to form the trench for the STI is carried out, chamber 34 being optimized for carrying out the dry etching process. Following trench forming dry etching process 208, the process wafer is optionally transferred via robotic arm 52 to ashing chamber, e.g., 32 where the photoresist is at least partially removed according to an oxygen plasma ashing process 210. Following process 210, the process wafer is preferably transferred to a separate chamber, e.g., 44, again using robotic arm 52 for transfer through transfer space 54 under controlled ambient conditions for in-situ heating process 212 according to the present invention to remove residual contamination from the wafer surface prior to transfer to loadlock chamber e.g., 42 for unloading process 214.

According to the present invention, preferably, the heating plate includes an electrically resistively heated plate e.g., 50 with a heat exchange surface (see FIG. 3) in thermal communication (heat exchange relationship) with the semiconductor wafer for in-situ heating of the semiconductor wafer. For example, the electrically resistively heated plate 50 is in electrical communication by circuit lines A and B with a selectively variable power source 46 which is selectively controlled (programmable) by controller 48 over communication line C which is in responsive communication via line D with temperature sensor (not shown; see FIG. 3) disposed adjacent the heat exchange surface (not shown; see FIG. 3) including in heating plate 50. It will be appreciated that conventional communication lines for communication lines C and D may be used and conventional power lines A and B may be used. It will further be appreciated that wireless communication means may replace communication lines C and D.

Figure 3A:
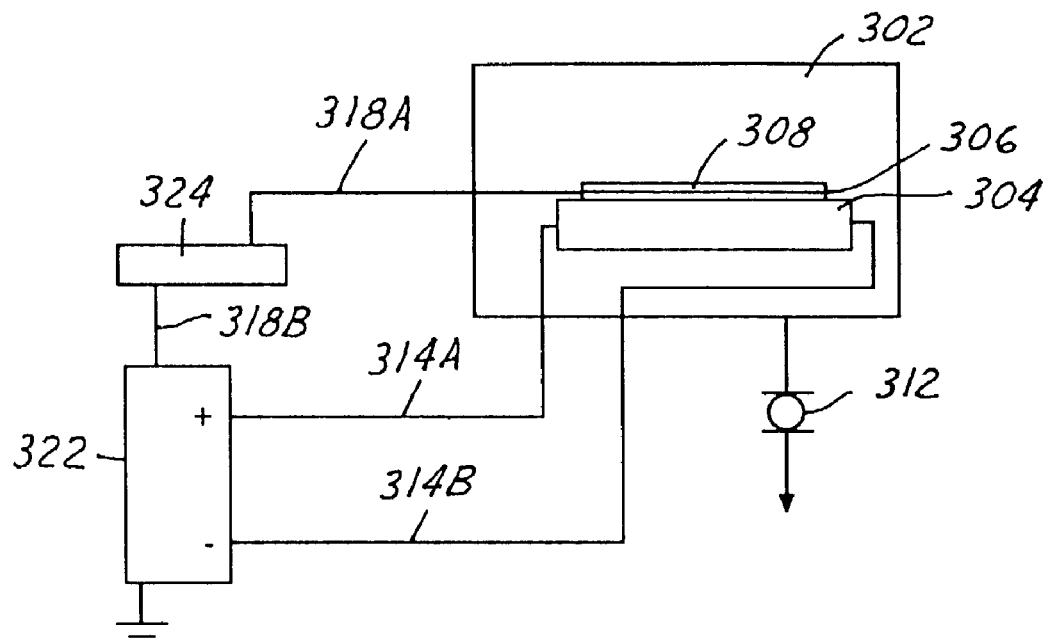
FIG. 3A is a schematic representation of showing one embodiment of a heating chamber used according to the present invention.
Figure 3B:
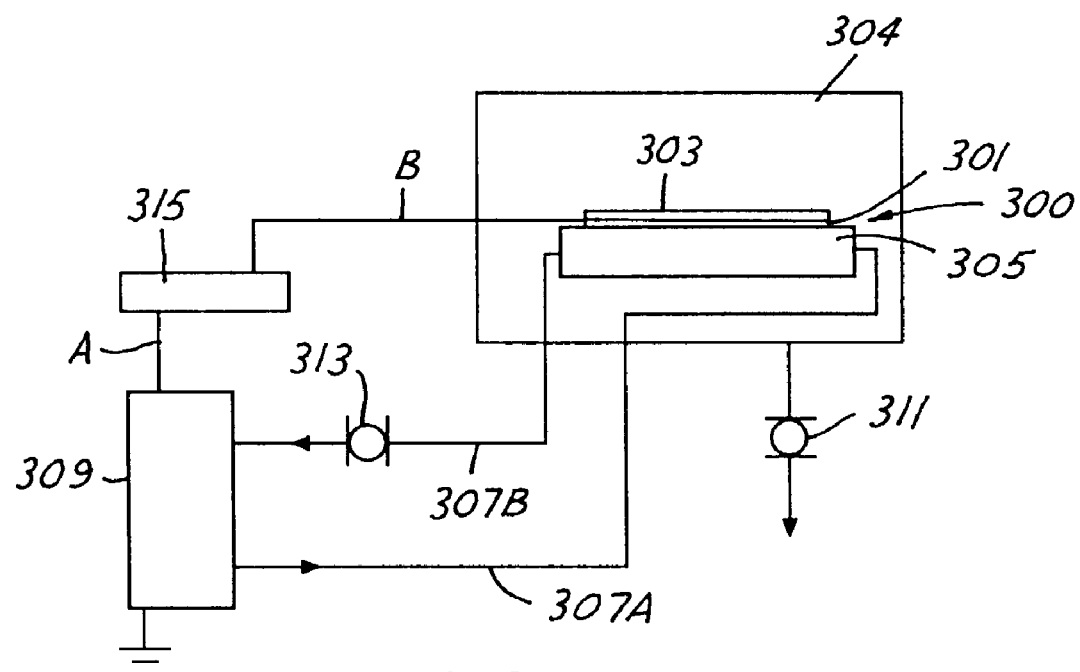
FIG. 3B is a schematic representation of another embodiment of a heating chamber used according to the present invention.

Less preferably, referring to FIG. 3B, the heating plate 300 may include a heat exchange surface 301 in thermal communication (heat exchange relationship) with the semiconductor wafer 303 the heat exchange surface being in thermal communication with a heat exchange manifold 305 supplied with a heat exchange fluid by fluid communication line 307A from heat exchanger 309 for heating the semiconductor wafer 303. For example, a heat exchange fluid may be passed through a wafer heating plate 300 disposed in heating chamber 304 including an external heat exchanger 309 in fluidic communication with the wafer heating plate 300 including a heat exchange surface 301 in heat exchange relationship with the semiconductor wafer 303 for heating the semiconductor wafer (process wafer). The heating chamber 304 is additionally equipped with an ambient control system including a vacuum pump 311 for controlling an ambient including removing vapors emitted from the semiconductor wafer during a heating treatment. In addition, heat exchange fluid pump 313 moves heat exchange fluid through fluid communication line 307B to heat exchanger 309. The heat exchanger 309 is preferably equipped with a first temperature sensor (not shown) for sensing a heat exchange fluid temperature in responsive communication via communication line A with controller 315 for controlling a temperature of the for example, electrical heat source (not shown), included in heat exchanger 309. Further, preferably, controller 309 is in responsive communication with second temperature sensor (not shown) disposed adjacent the heat exchange surface 301 via communication line B. The method of using fluidic heat transfer means is less preferable since the temperature response time is slower than response times of electrically resistive heating elements and is less amenable to carefully controlled ramped heating treatments including a temperature profile over time delivered to the heating plate.

According to the present invention, the heating plate is used to heat in-situ a semiconductor wafer to a temperature sufficient to vaporize a volatile condensed residue, including, for example, HBr or HCl remaining on the wafer surface following a dry etching process. While vaporizing the volatile residue, a vacuum system included in the controlled ambient chamber is simultaneously used to remove the vaporized gases from the chamber. Suitable pressures may be maintained with a range of 10 mTorr to 500 mTorr. A suitable wafer (or heat exchange surface) temperature for vaporizing volatile residual contamination from the wafer surface has been found to be within a range of about 80° C. to 120° C., although for removing residual HBr by a constant temperature heat treatment, the wafer temperature is most preferably about 80° C. Further, it has been found that removal of residual contamination, for example, HBr, by heating the process wafer to about 80° C. can be optimally performed by, for example, subjecting the process wafer to heating for a period of about 40 to about 90 seconds, most preferably about 40 to about 60 seconds thereby effectuating removal of about 87.5% of the residual volatile contamination. For example, following an etching process for manufacturing an STI feature using an etchant gas mixture of about 50% HBr together with He, $O_2$, $CF_4$, and $Cl_2$, in-situ heating of the semiconductor wafer with a heating plate included in, for example, the cooling down chamber 34, reduced the detectable HBr concentration from about 0.8 ppm to about 0.1 ppm with a lower detection limit of 0.03 ppm using TLD detection.

It will be appreciated by the skilled practitioner that the process time may be varied by altering the pumping speed (or pressure) and/or by altering wafer temperature. For example, a heat ramping method (temperature profile over time) may be advantageously used with a resistively heated heating plate whereby the wafer (heat exchange surface) temperature is ramped at a rate of, for example, 30° C. per minute starting from about 80° C. to about 110° C. over a period of 60 seconds. The advantage of a heat ramping method is that the volatile residue vaporizes with a maximum in vaporization rate thus reducing the likelihood of recondensation events and shortening the required heating time compared to a constant temperature heating treatment of for example, 80° C. for about 90 seconds. It will be appreciated that a suitable in-situ heating treatment will depend on the vapor pressure of the residual contamination as well as the porosity of the treatment surface. For example, it may be more preferably to use a ramped heat treatment where porous surfaces are present to minimize re-condensation events.

According to the present invention, the process wafer is preferably heated by resistive means. Any means including electrically resistive heating elements either embedded in a thermally conductive wafer holding surface (heat exchange surface) or in contact with a thermally conductive wafer holding surface (heat exchange surface) may be used. Preferably, the electrical power source includes a means for increasing the current at a selectable rate, for example, with an automated variable resistor or automated variable voltage source, thereby selectively controlling the current passing through resistive heating elements in thermal communication (heat exchange relationship) with a wafer holding surface (heat exchange surface). Preferably, a programmable controller is interfaced with the power source to enable a selectively programmable (preselected) heating treatment including controlling a temperature profile of the heat exchange surface over time.

Further, the chamber walls may optionally be fitted with resistive heating elements to minimize re-condensation onto the walls of the chamber volatile residues (e.g., HBr or HCl) that have been vaporized from the process wafer.

Referring to FIG. 3A where the heating chamber is shown in greater detail, in operation, heating chamber 302 houses heating plate 304 equipped with resistive heating elements (not shown) in thermal communication (heat exchange relationship) with a heat exchange surface 306 the resistive heating elements being in electrical communication with power source 322 located externally to the chamber 302 the chamber ambient pressure being maintained under vacuum by vacuum pump 312. Power is supplied by power source 322 by way of electrical power line 314A and 314B to heating plate 304 in thermal communication (heat exchange (relationship) with heat exchange surface 306 which in turn is in thermal communication (heat exchange relationship) with semiconductor wafer 308 whereby heat is conductively transferred between the heat exchange surface 306 and semiconductor wafer 308 to heat semiconductor wafer 308. Temperature sensor (not shown) for sensing a temperature of heat exchange surface 306 is in responsive communication with controller 324 by communication line 318A whereby the controller 324 responsively computes an increase in current (voltage) needed for heat exchange surface 306 to reach a preselected (programmed) temperature according to a preselected (programmed) time and responsively communicates with power controller 322 by communication line 318B to vary the voltage (current) supplied to resistive heating elements included in heating plate 304.

A communication line (not shown) may optionally be included from controller 324 to vacuum pump 312 to responsively alter a pumping speed depending on either pressure or temperature. For example, in a programmed ramped heat treatment, the pumping speed may be selectively programmed to increase correspondingly with the temperature or pressure, thus increasing the pumping speed to remove the volatile residue as the vaporization rate increases.

According to the present invention it has been found, for example, that HBr concentrations present on a process wafer following an etching process according to the prior art were at levels of 0.8 ppm. In contrast, after heating the process wafer according to the present invention, HBr concentrations present on a process wafer following an etching process, for example, an STI etching process, were reduced to about 0.1 ppm. As a result, residual contamination levels were reduced on the semiconductor wafer and consequently in the process and loadlock chambers. Further, wafer processing defects due to corrosive action were likewise reduced thereby increasing overall wafer processing throughput, yield, and semiconductor feature (e.g., STI features) quality. Moreover, the corrosive action to the etching system parts such as the robotic arm and chamber parts due to corrosive action of acidic volatile residues such as HBr resulting from prior art ex-situ heating methods are alleviated according to the present invention.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method for in-situ reduction of volatile residual contamination on a semiconductor process wafer following a plasma etching process comprising the steps of:
   first performing a plasma etching process;
   providing an ambient controlled chamber for accepting transfer of a semiconductor process water under controlled ambient conditions following a plasma etching process;
   providing a heat exchange surface disposed within the ambient controlled chamber in thermally conductive heat exchange relationship with a thermally conductive heating source;
   then transferring the semiconductor process wafer under controlled ambient conditions to the ambient controlled chamber, said semiconductor process wafer comprising volatile residual contamination following the plasma etching process;
   mounting the semiconductor process wafer in heat exchange relationship with the heat exchange surface; and,
   then heating in-situ the heat exchange surface by thermal conduction for a time period to thereby heat the semiconductor process wafer to vaporize the volatile residual contamination while simultaneously removing a resulting vapor from the ambient controlled chamber.

2. The method of claim 1, wherein the step of heating in-situ is carried out at a substantially constant temperature.

3. The method of claim 1, wherein the step of heating in-situ is carried out while increasing a heating temperature of the semiconductor process wafer over the time period.

4. The method of claim 3, wherein the heating temperature is increased over a temperature range at a constant rate.

5. The method of claim 1, wherein tho step at heating in-situ is carried out for the time period sufficient to remove from about 50 percent to about 100 percent of the volatile residual contamination.

6. The method of claim 1, wherein the ambient controlled chamber is included in a plurality of ambient controlled chambers including a shared ambient transfer space.

7. The method of claim 1, wherein the heating source comprises electrically resistive heating elements.

8. The method of claim 1, wherein the semiconductor process water is heated within a temperature range of about 80 degrees Centigrade to about 120 degrees Centigrade.

9. The method of claim 1, wherein the step of heating in-situ comprises a pressure of 10 milliTorr to 500 milliTorr.

10. Tho method of claim 1, wherein the heating source comprises a heat exchange fluid heated by a heat exchanger.

11. The method of claim 1, wherein a temperature sensor is provided proximate the heat exchange surface, said temperature sensor in communication with a controller for controlling a rate of thermal energy delivered to the heat exchange surface.

12. The method of claim 11, wherein the controller is selectively programmable to effectuate a heating profile over time at the heat exchange surface.

13. The method of claim 1, wherein the volatile residual contamination is selected from the group consisting of HBr, HCl and HF.

14. A method for in-situ reduction of volatile residual contamination on a semiconductor process wafer following a shallow trench isolation (STI) plasma etching process comprising the steps of:
   first performing a plasma etching process;
   providing an ambient controlled chamber for accepting transfer of a semiconductor process wafer under controlled ambient conditions following the STI plasma etching process;
   providing a heat exchange surface disposed within the ambient controlled chamber in thermally conductive heat exchange relationship with a thermally conductive heating source;
   then transferring the semiconductor process wafer to the ambient controlled chamber, said semiconductor process wafer comprising volatile residual contamination contacting a silicon surface, said volatile residual contamination comprising a species selected from the group consisting of bromine and chlorine;
   mounting the semiconductor process wafer in heat exchange relationship with the heat exchange surface; and,
   then heating the semiconductor process wafer to vaporize the volatile residual contamination while simultaneously removing a resulting vapor from the ambient controlled chamber.

15. The method of claim 14, wherein the STI plasma etching process comprises source gases selected from the group consisting of HBr and $Cl_2$.

16. The method of claim 14, wherein the semiconductor process wafer comprises a porous surface.

17. The method of claim 14, wherein the step of heating comprises increasing a temperature of the semiconductor process wafer over time according to a predetermined temperature profile.

18. The method of claim 1, further comprising heating the ambient controlled chamber during the step of heating.

19. The method of claim 1, further comprising heating the ambient, controlled chamber during the step of heating.

20. The method of claim 1, wherein the plasma etching process comprises a shallow trench isolation (STI) etching process.

* * * * *